June 18, 1963 J. T. A. VAN LOTTUM 3,094,627
REDUCTION OF DISTORTION IN PULSE-TRANSMISSION CIRCUITS
Filed May 5, 1958
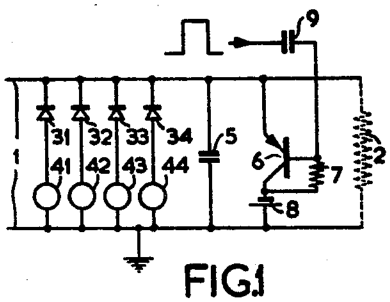
FIG.1
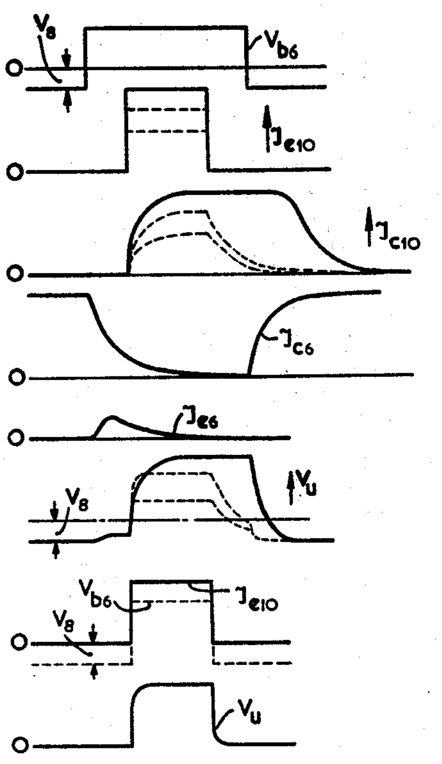
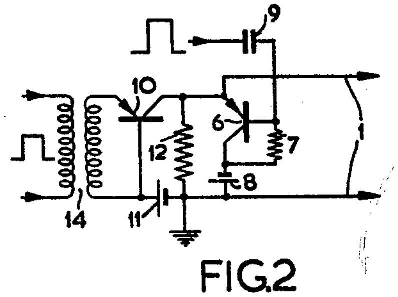
FIG.2
FIG.3
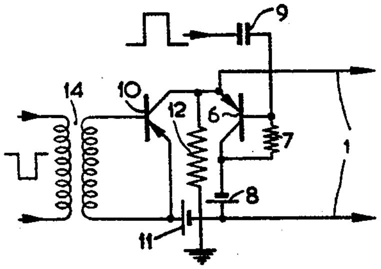
FIG.4
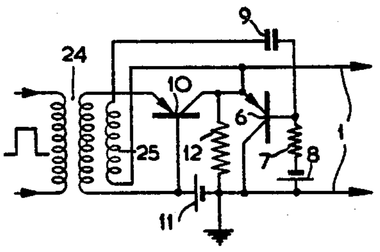
FIG.5
INVENTOR
JOHANNES THEODORUS ANTONIUS VAN LOTTUM
BY
Frank R. Jifani
AGENT United States Patent Office 3,094,627
Patented June 18, 1963

3,094,627

REDUCTION OF DISTORTION IN PULSE-TRANSMISSION CIRCUITS

Johannes Theodorus Antonius van Lottum, Eindhoven, Netherlands, assignor to North American Philips Company, Inc., New York, N.Y., a corporation of Delaware
Filed May 5, 1958, Ser. No. 733,114
Claims priority, application Belgium May 24, 1957
7 Claims. (Cl. 307—88.5)

The present invention relates to pulse-transmission circuits having a point of constant potential and comprising a parasitic capacitance which is active between this point and an output terminal, the circuits being utilized especially but not exclusively for transmitting amplitude-modulated pulses.

Many pulse-transmission circuits possess a considerable parasitic parallel capacity which, in combination with other elements of the circuit, constitutes a circuit having a time constant, due to which the pulses to be transmitted are unduly deformed. This is, for example, the case in a so-called "multiple," to which a plurality of inputs are connected, for example through gate circuits, the parasitic capacity of the multiple being equal to or exceeding the sum of the parasitic capacities of all the input circuits.

Each voltage step applied to the transmission circuit in the form of a pulse to be transmitted is "rounded off" according to the time constant of this circuit, since it has to charge or discharge its parasitic capacity. If the transmission circuit comprises a transistor, for example an amplifying transistor, the parasitic capacity is increased by the capacity of the transistor, in particular by its collector-capacity. Even apart from this capacity, the use of the amplifying transistor involves a distortion of the pulses, which may even exceed the distortion caused by the total parasitic capacity.

In general, the cut-off frequency of a transistor, particularly of a junction transistor, is lower than that of a tube so that, with decreasing pulse width, square pulses are very soon distorted by a transistor amplifier; the distortion often takes the form of a lengthening of the pulse. This distortion is mainly caused by the diffusion time-constant of the transistor, that is to say by the average delay with which the charge carriers injected by the emitter due to an input pulse reach the collector under the influence of the electric field in the proximity of the collector, or are drawn off from the base-zone upon termination of the input pulse. The distortion is particularly strong if the voltage drop across the load impedance or output impedance of the amplifier caused by the output pulse reaches such a value that the emitter-collector voltage becomes substantially zero. The electric field between the emitter- and collector-electrodes is then weak, so that free charge carriers are stored in the base-zone of the transistor (hole storage). Undue distortion of the pulses may, however, also occur before such collector-current saturation. At the beginning of the input pulse, the electric field is strong in the proximity of the collector, so that the beginning of the leading edge of the output pulse is steep. The steepness of this edge then gradually decreases and the pulse is rounded off. At the end of the input pulse the electric field is comparatively weak so that the charge carriers present in the base-zone are first slowly drawn off and partly diffuse to the emitter-electrode; the phenomenon may produce an inverse emitter-current. The voltage between the collector and the emitter does not reach its initial value until all the free charge carriers have been drawn off by the collector-electrode, hence the collector-current finally decreases more slowly than it increased at the beginning of the pulse. In other words, the "charging" of the base-zone begins with a comparatively steep slope and terminates with a small slope, while its "discharge" begins with a small slope under the action of a weak electric field and terminates with a small slope, such as that of a capacitor, due to the decreasing concentration of free charge carriers. The result is a rounding-off, a smoothing and in particular a considerable and often very objectionable lengthening of the input pulse.

A lengthening of the transmitted pulses is particularly undesirable in a multiplex system with pulse-amplitude modulation, where it may cause cross-talk between any given channel and the chronologically following channel.

The present invention has for its purpose to provide an improved pulse-transmission circuit, in which the aforesaid distortion, and in particular the lengthening of the input pulses, is eliminated or at least reduced.

In tube amplifiers, very short pulses are also deformed and lengthened due to unavoidable parasitic capacitances. Therefore, means have been sought to mitigate this distortion. "Post-Office Electrical Engineering Journal" No. 2 of 1954, pages 102 ff., describes a circuit arrangement, in which the parasitic capacitance in a multiplex system with amplitude-modulation becomes abruptly discharged at the end of each channel time interval through a controlled rectifier and a source of pulses, and consequently rendered less detrimental (see in particular FIG. 10, page 103). However, the effect of this step is restricted by the internal impedance of the pulse source. Moreover, it does not permit the slope of the leading edge of the transmitted pulses to be increased.

The present invention provides a similar improved step, with the help of which an input pulse can be transmitted with comparatively steep leading and trailing edges and a lengthened transmitted pulse can be kept within a given channel time interval. The pulse-transmission circuit according to the invention has the feature that the emitter electrode of a transistor is connected to an output terminal of the transmission circuit having a variable potential, while its collector electrode is directly connected to a point of constant potential, this transistor being of such conductivity type that its emitter is driven in the forward direction by the pulses to be transmitted, and that control-signals are applied to the base of said transistor such that its normally conductive emitter-collector path is blocked prior to or during the beginning of each of the pulses to be transmitted, and becomes conductive again before termination of each of the pulses produced at the output terminal, so that the distortion of the leading edge of the transmitted pulses caused by the parasitic capacity is at least partly compensated by free charge-carriers stored in the base-zone of the transistor and diffusing back to its emitter, while the lengthening of the pulse caused by the parasitic capacitance is restricted.

The control signals for the transistor may, for example, be clock-pulses. For example, in a multiplex system, these clock-pulses will then chronologically correspond to successive time intervals of the several channels. Further, a control signal can sometimes be derived from the pulses to be transmitted, so that these pulses control the effective value of the impedance active at the output terminal. Further, by controlling this transistor, partial compensation of the effect of the diffusion-time constant of an optional amplifying transistor connected in the transmission circuit can be achieved by the effect of the diffusion time constant of the first-mentioned transistor.

In order that the invention may be readily carried into effect, examples will now be described in detail with reference to the accompanying drawing, in which FIG. 1 shows the schematic diagram of a first example of the pulse-transmission circuit according to the invention, FIG. 2 shows the schematic diagram of a second example, FIG. 3 is a diagram for explaining the operation of the example shown in FIG. 2, and FIGURES 4 and 5 are schematic diagrams of two variants of the example shown in FIG. 2.

The first example shown in FIG. 1 comprises a multiple 1 made up of a double line, one conductor of which is connected to a point of constant potential (ground). This line has a characteristic impedance represented in broken lines by a resistor 2 connected to its output terminals. Several input circuits are connected between the conductors of the line. Each of these input circuits is represented by a series-rectifier 31 to 34 and a source of signal pulses 41 to 44. Through each of the input circuits, the total number of which may be large, for example 40 to 50, modulated pulses are applied to the line 1 during given channel time intervals allotted to them. The line 1 has a given internal capacitance which is increased still further by the sum of the internal capacitances of all of the input circuits. The sum of these capacitances constitutes a parasitic capacitance represented by a capacitor 5. This parasitic capacitance causes distortion of the pulses transmitted from the input circuits. The leading edge of each pulse is rounded off, since the pulse has to charge the capacitor, and the trailing edge of each pulse is likewise rounded off, since the capacitor has to discharge through the characteristic impedance 2. The slope of the leading edge of each pulse is at first comparatively high and finally drops gradually as the charge of the capacitor 5 approaches the peak value of the input pulse. The trailing edge initially has a steep slope which gradually decreases as the capacitor 5 discharges. The curved part of the trailing edge of each pulse constitutes a lengthened part of this pulse and may eventually extend into the chronologically following channel time interval. If the input pulses are amplitude-modulated this may consequently cause cross-talk between successive channels, which is very objectionable.

In accordance with the invention, the emitter-collector circuit of a pnp transistor 6 is connected between the two conductors of the line 1, its collector being directly connected to a point of constant potential and its emitter being directly connected to the ungrounded conductor of the line 1, while its base is biased in the forward direction by means of a resistor 7 connected to the collector and a battery 8 included in the collector circuit.

Control pulses are applied to the base electrode of the transistor 6 through a capacitor 9. These control pulse correspond to the chronologically successive channel time intervals of the transmission system. These control pulses are strong positive pulses blocking the pnp-transistor 6 during each of the channel time intervals. Between the control pulses, the emitter-collector circuit of the transistor 6 is conductive so as to substantially short-circuit the multiple 1. Each control pulse starts slightly before the beginning or at the beginning of a signal pulse. Between the control pulses free charge carriers are consequently injected by the emitter of the transistor 6 into its base-zone and a certain number of these charge carriers are stored in this base-zone owing to the diffusion time constant of the transistor 6. If a control pulse is applied to the base-electrode of the transistor 6, as a result of which the emitter-collector circuit of this transistor becomes abruptly blocked, a part of the stored free charge carriers diffuses back to the emitter. These charge carriers also tend to charge the parasitic capacitor 5 and consequently counteract the rounding-off of the leading edge of the signal pulse which has to be transmitted during the corresponding channel time interval, provided these pulses have the same polarity as the control pulses. In other words, the transistor 6 should be of such conductivity type that its emitter is driven in the forward direction by the pulses to be transmitted.

At the end of each control pulse, the emitter-collector circuit of the transistor 6 abruptly becomes conductive again. The increase of its effective collector capacitance is comparatively small over the major part of the variation of its effective emitter-collector voltage so that this transistor becomes conductive more rapidly than it is cut-off. Hence, the parasitic capacitor 5 becomes abruptly discharged through the emitter-collector circuit of the transistor 6, in as much as it had not been completely discharged so that the tail of each transmitted signal pulse is clipped and cannot extend into the chronologically following channel time interval.

In the second example, shown in FIG. 2, the transmission circuit comprises an amplifying transistor 10 in grounded-base arrangement. The base of this transistor is connected to the grounded conductor of the line 1 through a collector-voltage source 11. Its collector-electrode is connected to the non-earthed conductor of the line 1 and to the emitter-electrode of the transistor 6, while a collector-ballast resistor 12 is connected between the conductors of the line 1. The signal pulse sources 41 to 44 shown in FIG. 1 are replaced by a transformer 14, the secondary winding of which is directly connected between the emitter and the base of the transistor 10.

The transistor 10 has a given collector capacitance which, together with other parasitic capacitances, for example the internal capactance of the line 1, constitutes a parasitic capacitance. This capacitance involves distortion of the signal pulses, as described with reference to the example shown in FIG. 1. Moreover, the transistor 10 has a given diffusion time constant which is closely related to its cut-off frequency. Owing to this time constant the distortion of the signal pulses is still greater. If these pulses are not amplitude-modulated, the amplifying transistor 10 will often enough be driven into the saturation range, inter alia in order to limit the amplitude. In this case a considerable number of free charge carriers are stored in its base-zone. Even in the case of less strong control of the transistor 10, a considerable number of free carge carriers may be stored in its base-zone during each of the pulses to be transmitted. At the end of each of the pulses to be transmitted, these charge carriers diffuse further, partly to the collector of the transistor 10 and partly back to its emitter. The charge carriers diffusing to the collector cause further distortion of the trailing edge of the transmitted pulses, which consequently end in an objectionable, comparatively long tail. However, this tail is sharply clipped at the end of the control pulse applied to the base-electrode of the transistor 6, while the greater distortion of the leading edges of the pulses to be transmitted due to the diffusion time constant of the transistor 10 is at least partly compensated by the free charge carriers diffusing back to the emitter of the transistor 6, provided this diffusion process is not entirely terminated at the beginning of each pulse to be transmitted. This operation is illustrated by the diagram shown in FIG. 3.

The top line of FIG. 3, shows a control pulse ($V_{b6}$) applied to the base-electrode of the transistor 6. Beneath, an input pulse ($I_{e10}$) applied between the emitter and the base of the transistor 10 is illustrated. The third line of FIG. 3 shows the variation of the collector-current $I_{c10}$ of the transistor 10 as a function of time, and the variation of the collector current $I_{c6}$ of the transistor 6 is illustrated on the fourth line of FIG. 3. The fifth line shows the emitter-current ($I_{e6}$) of the transistor resulting from the free charge carrier diffusing back to its emitter-electrode. The sixth line of FIG. 3 shows the voltage pulse ($V_u$) produced at the output terminals of the line 1. The proportions in the case of saturation of the transistor 10 are shown in solid lines, while the proportions in the case of usual B-amplification by the transistor 10 are indicated in broken lines, two different values of the amplitude of the signal pulse corresponding to two different factors of amplitude-modulation being considered.

In the variant shown in FIG. 4, the transistor 10 is connected with grounded emitter. As a result it is more sensitive and its active diffusion time constant is increased approximately in the ratio between its α-cut-off frequency and its α'-cut-off frequency. The greater distortion due to its diffusion-time constant and/or the greater lengthening of the pulses due to discharge of the stored free charge carriers through its collector-circuit is however, the more to be counteracted.

The distortion of the leading edge of each of the pulses to be transmitted is better compensated if the leading edges of the control pulses applied to the base of the transistor 6 coincide chronologically with the leading edges of the signal pulses applied to the base of the transistor 10. This is realized by deriving the control pulses from the signal pulses. In the variant shown in FIG. 5, the input transformer 24 has a second secondary winding 25, which, in series with the input capacitor 9, is connected between the base of the transistor 6 and its emitter. A further difference with respect to the circuit arrangements shown in FIGURES 2 and 4 is that only the base of the transistor 6 is biased in the forward direction through the resistor 7 by the supply 8.

The last two lines of FIG. 3 illustrate the operation of the variant shown in FIG. 5. The control pulse $V_{b6}$ coincides chronologically with a pulse $I_{e10}$ to be transmitted, as illustrated in the seventh line of FIG. 3, while the lowest-line of FIG. 3 shows the voltage pulse $V_u$ at the output terminals of the pulse-transmission circuit shown in FIG. 5. The compensation of the "rounding-off" of the leading edge of the signal pulse is better than in the circuits shown in FIGURES 2 and 4, since the effect of the free charge carriers diffusing back to the emitter of the transistor 6 is better: this diffusion current coincides chronologically with the deformation of the leading edge of the pulse to be transmitted, caused by the diffusion time constant of the transistor 10. Lengthening of the pulses to be transmitted is precluded, since the transistor 6 becomes conductive exactly in synchronism with the trailing edge of the pulses to be transmitted.

In the circuit arrangements shown in FIGURES 1, 2, and 4, the transistor 6 operates with grounded collector, so that the control pulses must have an amplitude exceeding that of the transmitted pulses at the output terminals of the line 1 by more than the forward bias voltage applied to the base-electrode of the transistor 6. In the circuit arrangement shown in FIG. 5, the control pulses derived from the signal pulses are directly applied between the base and the emitter of the transistor 6. The second secondary winding 25 of the transformer 24 is consequently at a floating potential, which may give rise to difficulties in the case of comparatively high frequencies. As a result, however, control pulses having an amplitude exceeding that of the forward bias voltage applied to the base of the transistor 6 are sufficient to block this transistor.

Obviously, variants of each of these circuit arrangements are possible within the scope of the invention as defined in the claims. In particular, the control pulses may if desired be derived in any suitable manner from the pulses to be transmitted, or the leading edges of these control pulses may be synchronized with the leading edges of the pulses to be transmitted. Further, the control pulses may alternatively be common so-called clock-pulses supplied, for example in a multiplex telephone system or in a computer, by a central source of pulses.

What is claimed is:

1. A pulse transmission circuit having an output terminal and a parasitic capacitance between said output terminal and a point of constant potential, said circuit including means for eliminating adverse effects of said parasitic capacitance comprising a compensating transistor having emitter, base and collector electrodes, said emitter electrode being connected to said output terminal, said collector electrode being directly connected to a point of constant potential, a source of signal pulses connected to said circuit, said pulses having a polarity driving said emitter electrode in the forward direction, bias means for applying a forward bias voltage to said base electrode thus rendering said transistor normally conducting due to said bias and substantially short-circuiting said circuit, and control means for applying a reverse bias signal to said base electrode, said control means operating to apply said reverse bias signal to be effective for the duration of the leading edge of each signal pulse to block the normally conducting emitter collector path of said transistor and to unblock said path prior to the occurrence of the trailing edge of each signal pulse whereby the distortion of the leading edge of the transmitted pulses caused by the parasitic capacity is at least partly compensated by the diffusion back to the emitter of free charge-carriers stored in the transistor base zone, and the lengthening of the pulses caused by the parasitic capacitance is restricted.

2. A circuit as claimed in claim 1, wherein said reverse bias signal is derived from said source of signal pulses, the leading edge of each control pulse coinciding with the leading edge of the corresponding signal pulse.

3. A circuit as claimed in claim 1, further comprising an amplifying transistor having emitter, base and collector electrodes, the collector electrode of said amplifying transistor being directly connected to said output terminal, the internal collector capacitance of said amplifying transistor comprising at least part of said parasitic capacitance, said compensating and amplifying transistors being of the same conductivity type and having effective diffusion time constants of the same order of magnitude.

4. A circuit as claimed in claim 2, further comprising an amplifying transistor having emitter, base and collector electrodes, the collector electrode of said amplifying transistor being directly connected to said output terminal, the internal collector capacitance of said amplifying transistor comprising at least part of said parasitic capacitance, said compensating and amplifying transistors being of the same conductivity type and having effective diffusion time constants of substantially the same magnitude.

5. A circuit according to claim 3, wherein the base electrode of said amplifying transistor is connected to a point at constant potential, the respective cut-off frequencies of said compensating and amplifying transistors being of the same order of magnitude.

6. A circuit according to claim 3, wherein the emitter electrode of said amplifying transistor is connected to a point at constant potential, the respective cut-off frequencies of said compensating and amplifying transistors being of the same order of magnitude.

7. A circuit according to claim 4, wherein the base electrode of said amplifying transistor is connected to a point at constant potential, the respective cut-off frequency of said compensating and amplifying transistors being of the same order of magnitude.

References Cited in the file of this patent

UNITED STATES PATENTS

| | | |
|---|---|---|
| 2,730,576 | Caruthers | Jan. 10, 1956 |
| 2,853,632 | Gray | Sept. 23, 1958 |
| 2,858,438 | Merrill | Oct. 28, 1958 |
| 2,863,123 | Koch | Dec. 2, 1958 |
| 2,878,398 | Peterson | Mar. 17, 1959 |
| 2,935,690 | Bergfors | May 3, 1960 |
| 2,975,301 | Straube | Mar. 14, 1961 |